United States Patent
Gregor et al.

[11] Patent Number: 5,920,575
[45] Date of Patent: Jul. 6, 1999

[54] VLSI TEST CIRCUIT APPARATUS AND METHOD

[75] Inventors: Roger Paul Gregor, Endicott, N.Y.; Steven Frederick Oakland, Colchester, Vt.

[73] Assignee: International Business Machines Corporation, Armonk, N.Y.

[21] Appl. No.: 08/934,326

[22] Filed: Sep. 19, 1997

[51] Int. Cl.$^6$ .................................................. G06F 11/00
[52] U.S. Cl. ...................................................... 371/22.31
[58] Field of Search ............................... 371/22.31, 22.1, 371/22.32, 22.5, 22.6, 25.1, 27.1; 395/183.06

[56] References Cited

U.S. PATENT DOCUMENTS

| | | | |
|---|---|---|---|
| 4,277,699 | 7/1981 | Brown et al. | 307/272 |
| 4,602,210 | 7/1986 | Fasang et al. | 324/63 |
| 4,961,013 | 10/1990 | Obermeyer, Jr. et al. | 307/480 |
| 4,961,031 | 10/1990 | Naksgawa et al. | 315/382 |
| 5,323,403 | 6/1994 | Elliott | 371/37.6 |
| 5,491,699 | 2/1996 | Scheuermann et al. | 371/22.1 |

*Primary Examiner*—Vincent P. Canney
*Attorney, Agent, or Firm*—Shelley M Beckstrand

[57] ABSTRACT

An LSSD MUX D flip flop includes a multiplexer, a master latch L1 and a slave latch L2. The inputs to the multiplexer are functional data D, scan data I, and the control is scan enable SE. The L1 master latch receives its input from the output of the multiplexer and is clocked by the NAND of a −FLUSH (−A CLOCK) with an +EdgeClock (−C CLOCK.) The L2 slave latch receives its data input from the output of the L1 master latch and is clocked with the AND of −FREEZE (B CLOCK) and +EdgeClock. The output of the flip flop is the output of the L2 slave latch. This flip flop structure supports edge sensitive, level sensitive, functional, scan, freeze, flush, and test operations.

22 Claims, 3 Drawing Sheets

VLSI TEST CIRCUIT APPARATUS AND METHOD

BACKGROUND OF THE INVENTION

1. Technical Field of the Invention

This invention relates generally to the field of electronic circuits and more particularly to a chip area efficient apparatus and method for providing both single clocked multiplexed data flip flop (MUX DFF) and level sensitive scan design (LSSD) scan flush testing capabilities.

2. Background Art

A most challenging item in VLSI design today is testing and test coverage. The IBM LSSD test methodology provides the highest test coverage of VLSI circuits, 100% coverage being achievable, but the disadvantage is that functional operation of the circuits requires two accurate clocks. MUX DFF is commonly used in the industry, and only one clock is required for functional operation, but the disadvantage is that data cannot be flushed through the scan path for system reset or manufacturing testing. The LSSD DMIMIC latch requires only one clock input for functional operation and is LSSD compatible, but the circuit implementation takes additional chip area (more than 30%) and it is not compatible with the industry MUX DFF scan methodology.

Consequently, there is a need in the art for a circuit providing the full capabilities of both MUX DFF and LSSD scan methodologies while requiring only about 10% more area than an LSSD latch alone.

Referring to FIG. 1, an example of a Level Sensitive Scan Design (LSSD) shift register latch (SRL), or basic LSSD polarity hold latch 100, is illustrated. Storage cells such as latches or flipflops are typically connected into a serial shift (scan) register for loading and unloading test vectors. The LSSD scan method typically used by IBM uses level-sensitive latches paired together as L1 master latch 101 and L2 slave latch 102 for scan operations. Each latch 101, 102 has at least one data port 104, 106, respectively, consisting of a data input 110, 114, respectively, and a clock input 112, 116, respectively. When the clock 112 or 116 is active, data is loaded into the corresponding latch on lines 110, 114, respectively. L1 master latch 101 has at least one data port 118 which receives scan data 120 when its LSSD A clock 122 is active. L2 slave latch 102 has at least one data port 106 which receives data 114 from L1 latch 101 when its clock, LSSD B clock 116, is active.

In this example, L1 master latch 101 has two ports 104, 118. C clock 112 enables functional data 110 into L1 master latch 101, and A clock 122 enables I scan data 120 into L1 master latch 101. B clock 116 enables L2 slave latch 102 to capture the data in L1 master latch 101 at its output 114. The output of L2 slave latch appears at Q output line 124.

The advantage of this LSSD approach is that there is completely separate control of the master and slave latch clocking times so that unique clocking methods and scan flush testing can be used. The disadvantage is that functional operation requires that two accurate clocks, B clock 116 and C clock 112, be provided to latches 101, 102. This causes increased complexity, clock skew, and the need for clock splitter circuits (an example of which is described hereafter) to be added into the logic if only a single clock is provided at the input.

Referring to FIG. 2, a second type of storage cell 130, called a multiplexed data flipflop (mux DFF, which is a D flipflop) 130 with only one clock 132 input to its L1 master latch 136 and L2 slave latch 137, is commonly used in industry. Inverter 139 inverts clock 132 for input to L1 master latch 136, and the data input 134 to L1 master latch 136 comes from a multiplexer 138 which selects between I scan data 140 and D functional data 142. The output of flipflop 146 appears at Q output line 146 from L2 slave latch 137. The advantage of this mux DFF approach is that only a single clock 132 is required to the storage cells 136, 137. Disadvantages are that data cannot be flushed through the scan path 140, 134, 144, 146 (for system reset or manufacturing test) and data path lengths (both functional data path 142, 134, 144, 146 and scan path 140, 134, 144, 146) must be long enough to avoid timing problems due to clock skew. By clock skew is meant the difference in arrival time of the clock signal 132 at different latches or flops 136, 137.

Referring to FIG. 3, a basic LSSD DMIMIC latch 200 is shown. This alternative for LSSD latches partially solves the functional clock problem by putting a clock splitter inside each latch, the L1 master latch 201 and L2 slave latch 202. Along with A clock 204, B clock 206 and C clock 208, an E clock 210 is provided. E clock 210 is inverted and fed to AND 213 along with C clock 208, the output forming the clock input 216 for clocking functional data 214 and A clock 204 clocks in I scan data 212. B clock 206 is fed to AND gate 217 along with E clock 210, and its output 218 is fed to L2 slave latch 202 for clocking the output 220 of L1 master latch 201. The output of L2 slave latch 202 appears at Q line 224. During functional operation, A clock 204 is held low, and B clock 206 and C clock 208 are held high while E clock 210 is used as the functional clock. This approach has the advantage of eliminating the need for a clock splitter in the clock distribution network and maintaining the LSSD properties of latches 201, 202. However, this DMIMIC 200 suffers from a number of problems which make its use unattractive. The main problem is that the additional circuitry adds about 30% to the physical area required for the latch 200, while an external clock splitter adds only about 15%. Therefore, using DMIMIC latches 200 costs chip area. The second problem is that the DMIMIC 200 requires an extra input (E clock 210) in order to provide the mimic function. A third problem is that this type of latch is still not compatible with the industry MUX DFF scan methodology.

Consequently, it is an object of the invention to provide a circuit which provides the full capabilities of both MUX DFF and LSSD scan methodologies.

It is a further object of the invention to provide a circuit which provides such full capabilities of both MUX DFF and LSSD scan methodologies while requiring only about 10% more area than an LSSD latch alone.

SUMMARY OF THE INVENTION

This invention provides an apparatus and method for providing both single clocked multiplexed data flip flop (MUX DFF) and level sensitive scan design (LSSD) scan flush testing capabilities.

In accordance with the apparatus of the invention, a flip flop apparatus comprises a multiplexer, a master latch and a slave latch. The multiplexer is operable under control of a scan enable signal for generating from functional data and scan data inputs to said flip flop a multiplexer output signal. The master latch is operable for generating a master latch output signal from the multiplexer output signal and the NAND of a flush signal with an edgeclock signal. The slave latch is operable for generating a flip flop output signal from the master latch output signal and the AND of a freeze signal and said edgeclock signal.

In accordance with a method of the invention this flip flop apparatus is selectively operable for performing edge sensitive, level sensitive, functional, scan, freeze, flush, and test operations.

Other features and advantages of this invention will become apparent from the following detailed description of the presently preferred embodiment of the invention, taken in conjunction with the accompanying drawings.

BEST MODE FOR CARRYING OUT THE INVENTION

The LSSD MUX DFF 300 of the invention hereafter described provides the full capabilities of both MUX DFF and LSSD scan methodologies while requiring only about 10% more area than an LSSD latch alone. Thus, the skew benefits of a single clock flipflop implementation and the test capabilities of both the MUX DFF and LSSD methodologies are available in a single storage cell for less area penalty than that for an external clock splitter. In addition, multiplexing the scan and functional data using transmission gates at the input of the latch has the benefit of reducing power. This power reduction results because there is almost no power dissipation caused by switching activity at the scan input while the functional data input is enabled (Scan Enable= logic 0).

Figure 1:
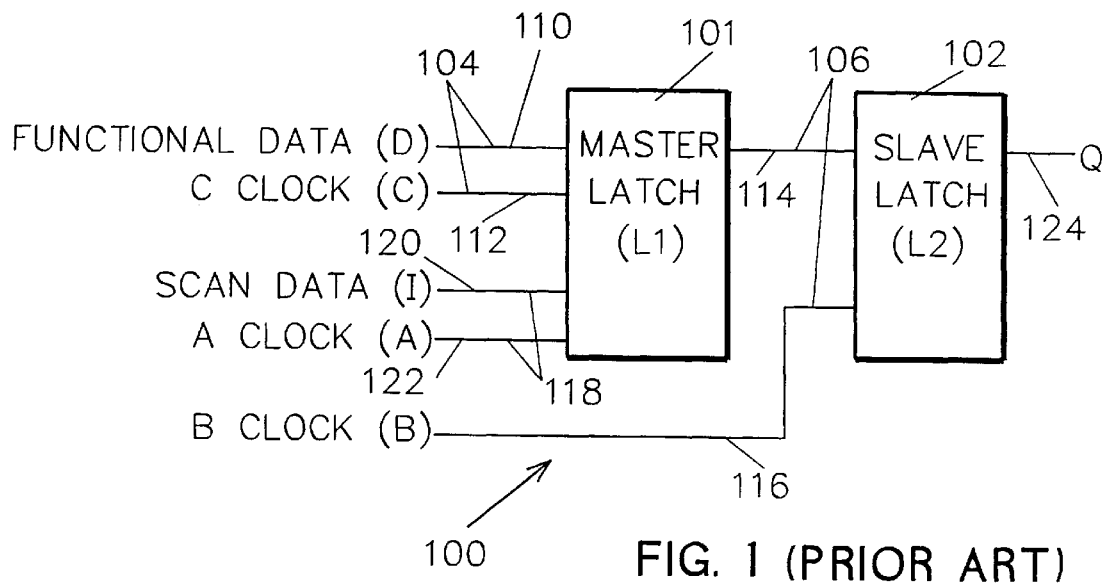
FIG. 1 is logic diagram of a prior art basic LSSD polarity hold latch.
Figure 2:
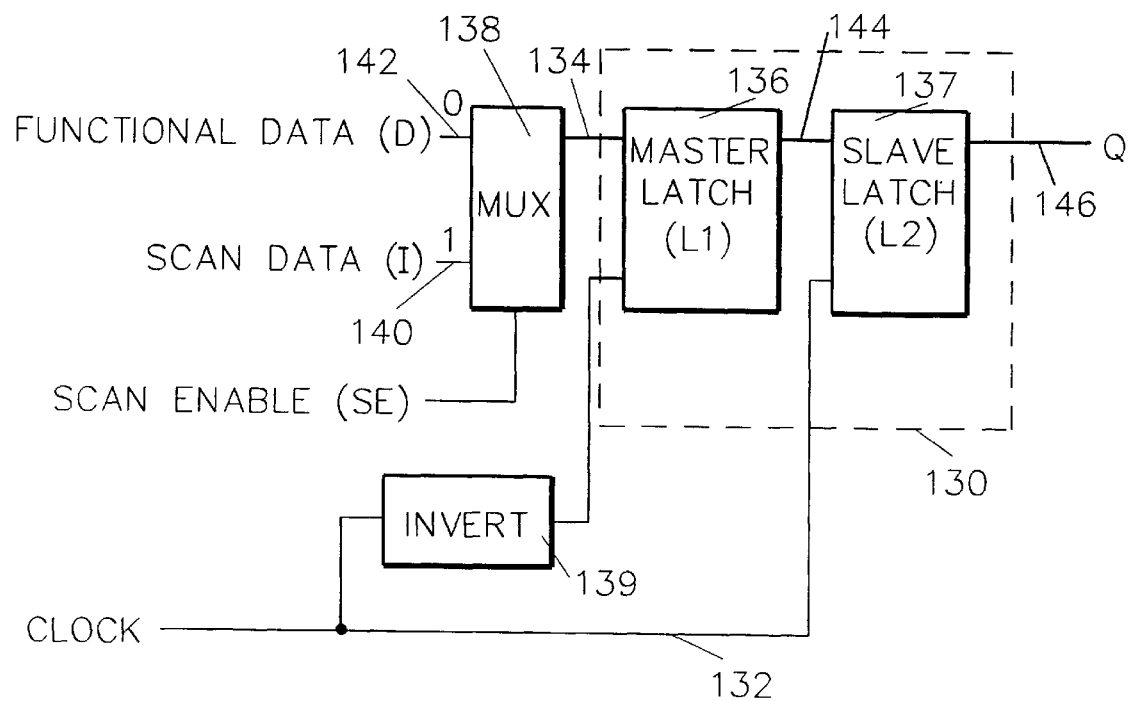
FIG. 2 is a logic diagram of a prior art basic MUX D flip flop.
Figure 3:
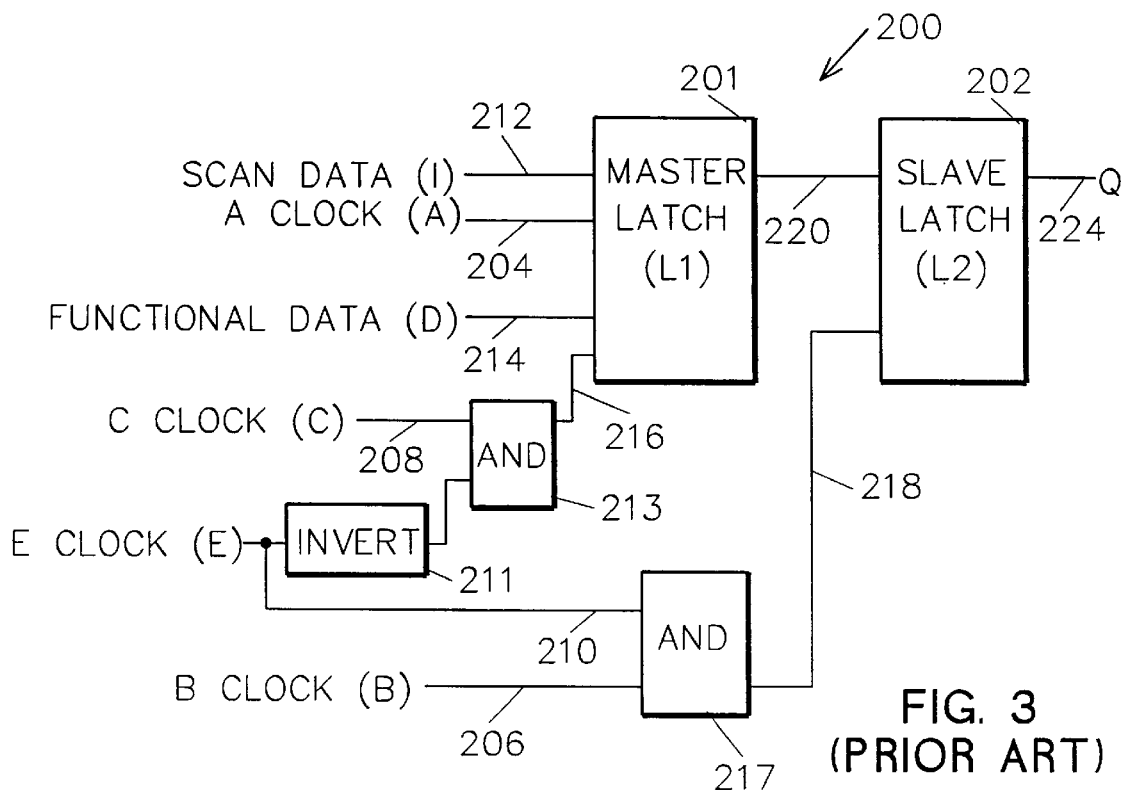
FIG. 3 is a logic diagram of a prior art basic LSSD DMIMIC latch.
Figure 4:
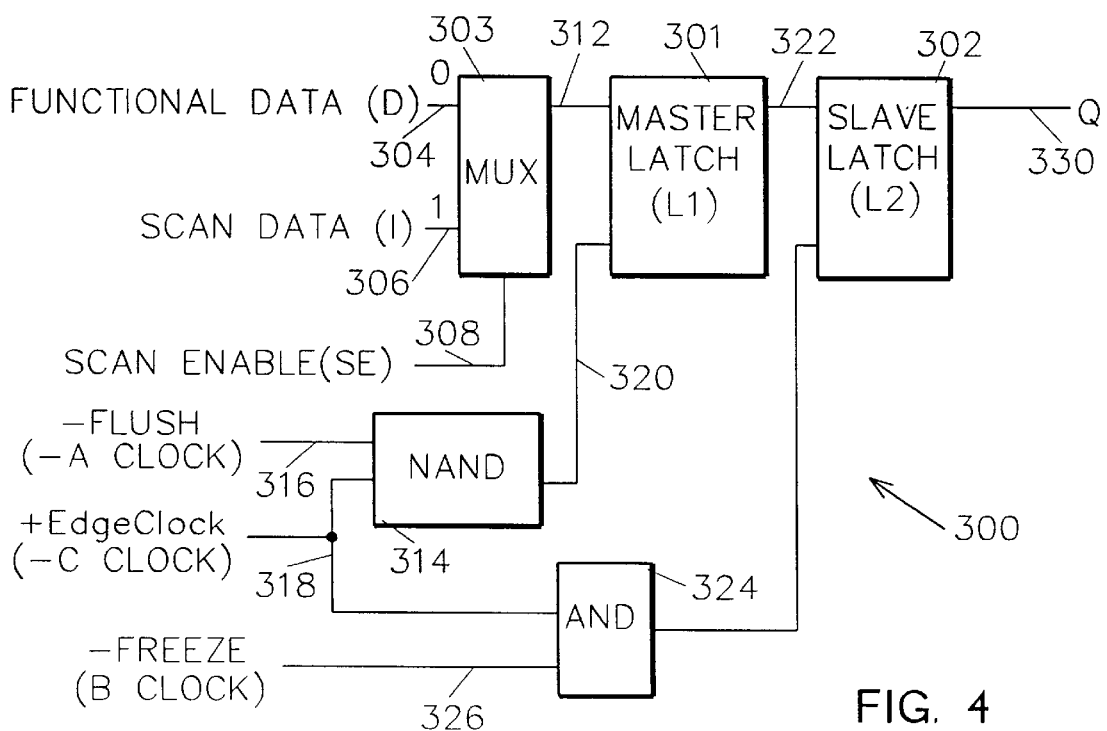
FIG. 4 is a logic diagram of the preferred embodiment of the LSSD MUX data flipflop of the invention.

Referring to FIG. 4, LSSD MUX D flip flop 300 includes input multiplexer 303 with functional data input D 304, scan data input I 306, and control input scan enable SE 308; L1 master latch 301 which receives its input 312 from the output of multiplexer 303 and is clocked by the NAND 314 of −FLUSH (−A CLOCK) 316 with the +EdgeClock (−C CLOCK) 318 on line 320; and L2 slave latch 302 which receives its data input 322 from the output of L1 master latch 301 and is clocked with the AND 324 of −FREEZE (B CLOCK) 326 and +EdgeClock 318. The output of flipflop 300 is the output of L2 slave latch 302 on line 330.

Referring further to FIG. 4, in operation for edge-sensitive operations, −FLUSH 316 and −FREEZE 326 signals are both held to logic 1, and +EdgeClock 318 is used as the clock input. Scan enable (SE) signal 308 controls whether input multiplexer 303 passes functional data D 304 or scan data I 306 to L1 master latch 301. When +EdgeClock signal 318 is a logical 0, NAND 314 output is a logical 1 and AND 324 output is logical 0, so L1 master latch 301 is enabled to accept input 312, while L2 slave latch 302 is disabled from changing state. When +EdgeClock 318 switches to a logic 1, L1 master latch 301 is disabled from accepting any new data on input 312, while L2 slave latch 302 is enabled; this propagates the data stored in L1 master latch 301 and present on its output 322 to the output of L2 slave latch 302 at Q 330. Thus, only a single clock, +EdgeClock 318 is used to clock the data.

For functional operation, scan enable SE 308 is held to logic 0 to enable input multiplexer 303 to pass functional data 304 to L1 master latch 301.

For Mux DFF scan operation, scan enable SE 308 is held to logic 1 to enable input multiplexer 303 to pass scan data I 306 to L1 master latch 301.

For freeze (clock gating), a logic 0 at −FREEZE (B clock) signal 326 prevents L2 slave latch 302 from changing state. This feature may be useful in reducing power by preventing switching activity in logic fed by latch 302 off Q 330.

For flush operation, although not normally available in an edge-sensitive clocking environment, in accordance with this invention, a flush mode is available with LSSD MUX DFF scan cell 300. For flush mode, data (either functional data 304 or scan data 306, depending upon the state of scan enable 308) is flushed through LSSD MUX DFF scan cell 300 by holding −FLUSH 326 at logic 0 while −FREEZE 326 and +EdgeClock 318 are held at logic 1. Even if +EdgeClock is allowed to continue pulsing, data will flush through during periods when +EdgeClock 318 is at logic 1. When a logic 0 is applied to scan enable 308, functional data 304 is flushed through latch 300; when a logic 1 is applied to scan enable 308, scan data 306 is flushed through the latch 300. This feature is useful for performing a system reset operation.

Referring still further to FIG. 4, with respect to LSSD test, in LSSD scan operations scan enable 308 and +EdgeClock 318 are both held to logic 1. This enables input multiplexer 303 to pass scan data 306, and enables −A clock (−FLUSH) 316 and +B clock (−FREEZE) 326 inputs to act as level-sensitive clocks. When −A clock 316 is held high and +B clock 326 is held low, both L1 master latch 301 and L2 slave latch 302 are disabled from accepting new data. Scanning is achieved by alternatively pulsing −A clock 316 low while +B clock 326 is held low, thus enabling data into L1 master latch 301, and then pulsing +B clock high while −A clock is held high, thus enabling L2 slave latch 302 to pass master data 322 to slave output Q 330. Flush mode is achieved by holding −A clock 316 low and +B clock 326 high at the same time, thus enabling both L1 master latch 301 and L2 slave latch 302 at the same time.

Referring still further to FIG. 4, with respect to LSSD test, in LSSD capture operations, after a test vector has been loaded into scan chains, the response of the test is captured in scan cells by pulsing one or more level sensitive clocks in sequence. To test logic feeding functional data input 304, for example, scan enable 308 is held to logic 0 while either −A clock 316 or −C clock 318 is pulsed from logic 1 to 0 and back to 1, followed by a pulse (from 0 to 1 and back to 0) on B clock 326.

Referring, finally, to FIG. 4, for level-sensitive functional operation, LSSD MUX DFF 300 is operated as a pair of level-sensitive latches. With +EdgeClock 318 held high, −A clock (−FLUSH) 316 and +B clock (−FREEZE) 326 inputs act as level-sensitive clocks. With scan enable 308 held low, input multiplexer 303 is enabled to pass functional data 304. When −A clock 306 is held high and +B clock 326 is held low, both L1 master latch 301 and L2 slave latch 302 are disabled from accepting new data. One cycle of operation is achieved by successively pulsing −A clock 316 low while +B clock 326 is held low, enabling data into L1 master latch 301, and then pulsing +B clock 326 high while −A clock 316 is held high, thus enabling L2 slave latch 302 to pass master data 322 to slave output Q 330.

Figure 5:
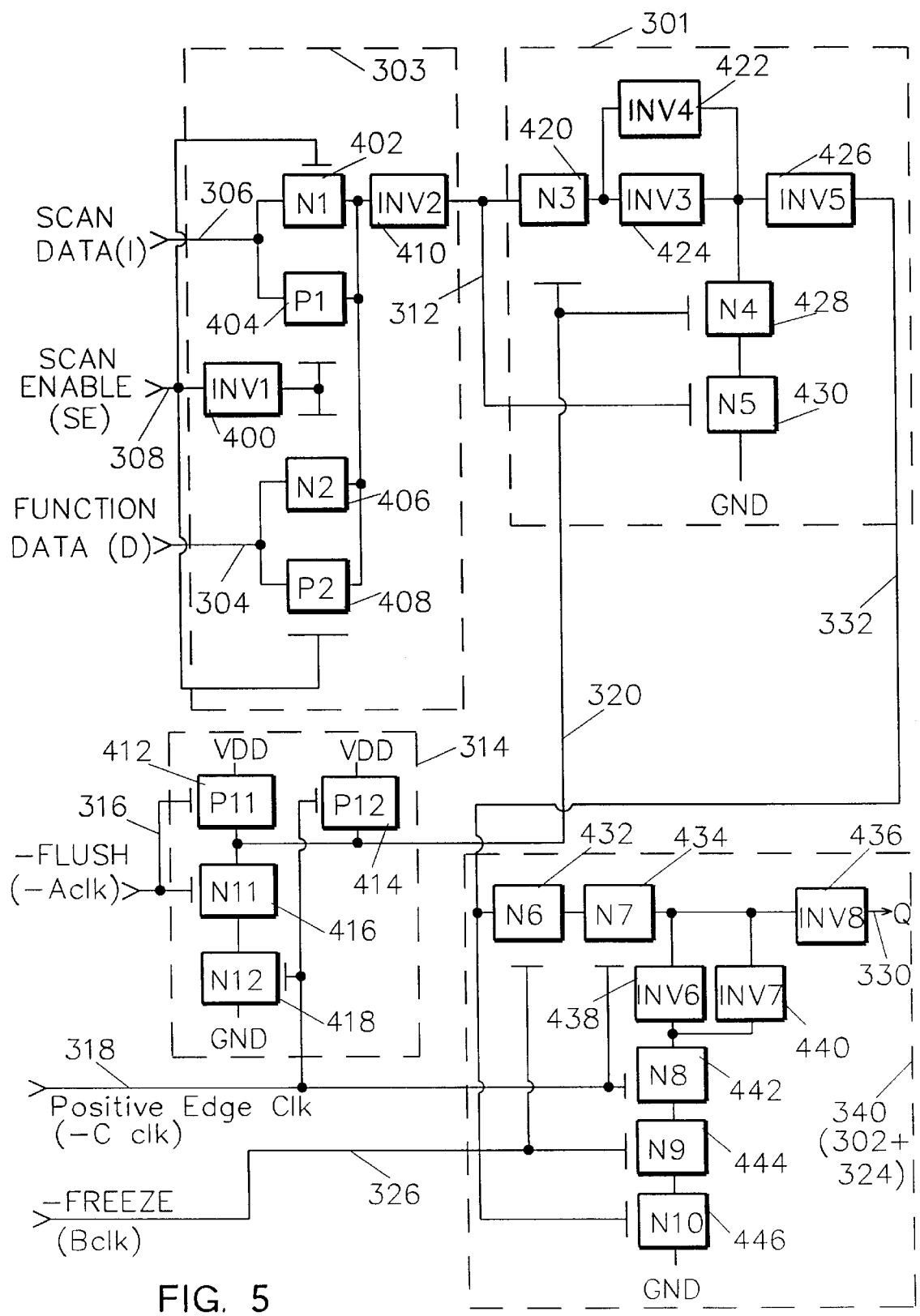
FIG. 5 is a circuit diagram of the LSSD MUX DFF of FIG. 4, in accordance with the preferred embodiment of the invention.

Referring now to FIG. 5, the circuit used for LSSD MUX DFF 300 is both efficient in area and high performance. In this FIG. 5, INV means a CMOS inverter, N is a negative field effect (Nfet) device, and P is a positive field effect (Pfet) device. In a Pfet, a negative gate voltage relative to the source of the Pfet enables current flow. In an Nfet, a positive voltage on the gate relative to the source of the Nfet enables current flow. The gain of the FET (either Nfet or Pfet) is dependent on the difference between the gate voltage and the source voltage minus some threshold voltage. If the source is tied to a fixed voltage, then when the device is on the drain will be pulled toward the source. If the drain is tied to the fixed voltage, then the source will be pulled toward the level of the drain, but it will be limited in how far the voltage can go by the minimum of either the drain voltage or the gate voltage minus the threshold voltage. Pfets and Nfets work the same, except that all the signs are inverted.

Multiplexer 303 comprises inverter 400, Nfet 402, Pfet 404, Nfet 406, Pfet 408 and inverter 410. L1 master latch comprises Nfet 420, inverter 422, inverter 424, inverter 426, Nfet 428 and Nfet 430. NAND 314, a standard CMOS NAND circuit, comprises Pfet 412, Pfet 414, Nfet 416 and Nfet 418. AND 324 and L2 slave latch 302 are combined in circuit block 340, and together comprise Nfet 432, Nfet 434, inverter 436, inverter 438, inverter 440, Nfet 442, Nfet 444 and Nfet 446.

The input lines include scan data 306, scan enable 308, function data 304, −FLUSH 316, +EdgeClock 318 and −FREEZE 326. Scan data 306 is fed to the drain inputs of Nfet 402 and Pfet 404. Functional data 304 is fed to the drain inputs of Nfet 406 and Pfet 408. Scan enable 308 is fed to the gates of Nfet 402 and Pfet 408, and is inverted at inverter 400, the output of which is fed to the gates of Pfet 404 and Nfet 406. The source outputs of Nfet 402, Pfet 404, Nfet 406, and Pfet 408 are tied together to form the input to inverter 410, the output of which appears on multiplexer output line 312. Line 312 is fed to the gate of Nfet 430 and the drain of Nfet 420.

−FLUSH 316 is fed to the gates of Pfet 412 and Nfet 416. +EdgeClock 318 is fed to the gates of Pfet 414, Nfet 418, Nfet 442 and Nfet 434. The sources of Pfet 412 and Pfet 414 are tied to supply voltage line VDD, and their drains are tied to the drain of Nfet 416 and via NAND output line 320 to the gates of Nfet 420 and Nfet 428. The source of Nfet 416 is tied to the drain of Nfet 418, the source of which is tied to ground.

The source of Nfet 420 is fed to the input of inverter 422 and the output of inverter 424. The output of inverter 422 is tied to the drain of Nfet 428, to the input of inverter 424, and to the input of inverter 426. The source of Nfet 428 is tied to the drain of Nfet 430, the source of which is tied to ground. The output of inverter 426 is L1 master latch 301 output line 322, which is fed to the drain of Nfet 432 and the gate of Nfet 446.

−FREEZE input line 326 is fed to the gates of Nfet 432 and Nfet 444. The source of Nfet 432 is fed to the drain of Nfet 434, the source of which is tied to the output of inverter 438, the input of inverter 440 and fed to the input of inverter 436, the output of which is L2 slave latch 340 output Q 330. The source of Nfet 446 is tied to ground and its drain to the source of Nfet 444, the drain of which is fed to the source of Nfet 442, the drain of which is tied to the input to inverter 438 and the output of inverter 440.

Referring further to FIG. 5, input multiplexer 303 is a common full complementary passgate multiplexer. When scan enable 308 is a logic 0, P2 Pfet 408 and N2 Nfet 406 are enabled to pass functional data 304 to the input of inverter 410 while P1 Pfet 404 and N1 Nfet 402 are disabled. When scan enable 308 is a logic 1, P1 Pfet 404 and N1 Nfet 402 are the enabled devices and pass scan data 306 to the input of inverter 410 while P2 Pfet 408 and N2 Nfet 406 are disabled.

NAND 314 is a standard CMOS NAND circuit, forming the NAND of −FLUSH 316 and +EdgeClock 318. The output of NAND 314 on line 320 forms the clock to L1 master latch 301.

In operation, L1 master latch is clocked by signal 320 from NAND 314, which is connected to the gate inputs of Nfet devices 420 and 428. When clock 320 goes high (logic 1), N3 Nfet 420 and N4 Nfet 428 are enabled. If the data at the output of inverter 410 is a logic 0, the latch consisting of inverter 424 and inverter 422 is set to a logic 0 at the input of inverter 422 by N3 Nfet 420. N4 Nfet 428 and N5 Nfet 430 do not affect the latch state because a logic 0 on inverter 410 output line 312 disables N5 Nfet 430. If the data at the output of inverter 410 on line 312 is a logic 1 while clock 320 is high, then N3 Nfet 420 pulls up one side of latch 422, 424 while devices N4 Nfet 428 and N5 Nfet 430 pull down the other side. This improves latch performance because the N3 Nfet 420 gain is not as good in a pullup (source follower operation). Inverter 426 is used to buffer the master latch 422, 424 so that the switching of slave clock 318 or B clock 326 does not upset L1 master latch 301.

AND gate 324 and L2 slave latch 302 are merged into a single circuit comprising inverter 438 and inverter 440, which form the latching function, inverter 436 which buffers the latch from output Q 330, and devices N6 Nfet 432, N7 Nfet 434, N8 Nfet 442, N9 Nfet 444 and N10 Nfet 446. The AND of +EdgeClock 326 with −FREEZE 318 is formed twice in circuit 340, once with N6 Nfet 432 and N7 Nfet 434 and the other with N8 Nfet 442 and N9 Nfet 444. The basic function of L2 slave latch 302 is identical to the operation of L1 master latch 301. If the gates of both N6 Nfet 432 and N7 Nfet 434 are high (i.e., an AND of the N6 Nfet 432 and N7 Nfet 434 inputs) and likewise the gates of N8 Nfet 442 and N9 Nfet 444 would also be high (an AND of the inputs of N8 Nfet 442 and N9 Nfet 444), then the data at the output of inverter 426 will be allowed to pass through to the latch formed by inverters 438 and 440. A logic 0 at the output of inverter 426 on line 322 with both N6 Nfet 432 and N7 Nfet 434 enabled, forces the output of inverter 438 to zero, thus resetting the latch to zero, which results in a logic 1 at the output of inverter 436 on Q line 330. When the output of inverter 426 is a logic 0, N10 Nfet 446 is disabled, so the path through N8 Nfet 442 and N9 Nfet 444 has no effect on the state of latch 438, 440. When the output of inverter 426 is a logic 1 and the gates of N6 Nfet 432, N7 Nfet 434, N8 Nfet 442 and N9 Nfet 444 are also at a logic 1, then the output of inverter 438 is pulled up through N6 Nfet 432 and N7 Nfet 434 while the input of inverter 438 is pulled down through N8 Nfet 442, N9 Nfet 444 and N10 Nfet 446 in series to speed up the latching to a logic 1.

Advantages over the Prior Art

The advantages of the method of the preferred embodiment of this invention include providing a logical design for a LSSD MUX D flipflop which provides full capabilities of both MUX DFF and LSSD scan methodologies while requiring only about 10% more area than an LSSD latch alone. It is a further advantage of the invention that such area is reduced by a circuit design merging of the AND function into the latch.

Alternative Embodiments

It will be appreciated that, although specific embodiments of the invention have been described herein for purposes of illustration, various modifications may be made without departing from the spirit and scope of the invention.

Accordingly, the scope of protection of this invention is limited only by the following claims and their equivalents.

I claim:

1. A flip flop apparatus comprising:
   a multiplexer operable under control of a scan enable signal for generating from functional data and scan data inputs to said flip flop a multiplexer output signal;
   a master latch for generating a master latch output signal from said multiplexer output signal and the NAND of a flush signal with an edgeclock signal; and
   a slave latch for generating a flip flop output signal from said master latch output signal and the AND of a freeze signal and said edgeclock signal.

2. A flip flop apparatus comprising:
   a multiplexer operable under control of a scan enable signal line for generating from functional data and scan data inputs to said flip flop a multiplexer output signal;
   a master latch including a first data input port, a first clock input port and a first output port, and responsive at said first data input port to said multiplexer output signal and at said first clock input port to the NAND of a flush signal with an edgeclock signal for generating a master latch output signal; and
   a slave latch including a second data input port, a second clock input port and a second output port, and responsive at said second data input port to said master latch output signal and at said second clock input port to at said second clock input port to the AND of a freeze signal and said edgeclock signal for generating a flip flop output signal.

3. A storage cell providing both MUX DFF and LSSD scan methodologies, comprising
   a first transmission gate at an input to said storage cell for receiving functional data;
   a second transmission gate at an input to said storage cell for receiving scan data; and
   a multiplexer for multiplexing said scan data and said functional data;
   whereby substantially no power dissipation is caused by scan data switching activity when functional data is enabled at said multiplexer.

4. The storage cell of claim 3, further comprising:
   a master latch for generating a master latch output signal from the output of said multiplexer and the NAND of a flush signal with an edgeclock signal; and
   a slave latch for generating a flip flop output signal from said master latch output signal and the AND of a freeze signal and said edgeclock signal.

5. The flip flop apparatus of claim 1, further including a flush input, an edgeclock input, and a freeze input; said multiplexer including a functional data input port, a scan data input port and a scan enable control port; said master latch including a first data input port and a first clock input port and a master latch output port; and said slave latch including a second data input port and a second clock input port and a flip flop output port.

6. The flip flop apparatus of claim 5, selectively operable for performing edge sensitive, level sensitive, functional, scan, freeze, flush, and test operations.

7. The flip flop apparatus of claim 5, further comprising:
   a NAND gate for generating a NAND signal from said flush and said edgeclock inputs;
   an AND gate for generating an AND signal from said freeze and said edgeclock inputs; and
   said flip flop apparatus being operable responsive to said flush input and said freeze input being held to logical 1 for performing edge sensitive operations clocked by said edgeclock input.

8. The flip flop apparatus of claim 7, further comprising:
   said multiplexer responsive to a scan enable signal at said scan enable input port for passing scan data to said master latch and responsive to a not scan enable signal at said scan enable input port for passing functional data to said master latch;
   said master latch being responsive to said NAND signal being logical 1 for accepting data from said multiplexer and said slave latch being responsive to said AND signal being logical 0 for holding state; and
   said master latch being responsive to said NAND signal being logical 0 for holding state and said slave latch being responsive to said AND signal being logical 1 for propagating data stored in said master latch to said flip flop output port;
   whereby a single clock, the edgeclock, is used to clock data through said flip flop.

9. A flip flop for performing edge sensitive operations, comprising:
   a multiplexer operable under control of a scan enable signal for generating selectively from functional data and scan data inputs to said flip flop a multiplexer output signal;
   a master latch for generating a master latch output signal from said multiplexer output signal and the NAND of a flush signal with an edgeclock signal;
   a slave latch for generating a flip flop output signal from said master latch output signal and the AND of a freeze signal and said edgeclock signal; and
   said edgeclock signal operable when said flush signal and said freeze signal are both logical 1 for clocking data from said multiplexer through said master latch and said slave latch to the output of said flip flop.

10. The flip flop of claim 9 further operable responsive to said scan enable signal being held to logic 0 for performing functional operations.

11. The flip flop of claim 9 further operable responsive to said scan enable signal being held to logic 1 for performing scan operations.

12. The flip flop of claim 9 further operable responsive to said freeze signal being held to logic 0 for performing freeze operations, whereby said slave latch is held frozen in state to reduce power by preventing switching activity in logic fed by said slave latch.

13. The flip flop of claim 9 further operable responsive to said flush signal being held at logic 0 while said freeze signal and said edgeclock signals are held at logic 1 for performing flush operations, whereby responsive to said scan enable being logical 1 scan data is flushed through said flip flop and responsive to said scan enable being logical 0 functional data is flushed through said flip flop.

14. The flip flop of claim 9 further operable for performing test operations including scan data pass mode responsive to said scan enable and said edgeclock signals being held to logic 1 to enable said multiplexer to pass scan data and said flush and freeze signals to act as level sensitive clocks; disabled mode disabling both said master latch said slave latch from accepting new data responsive to said freeze signal being held to logical 0 and said flush signal being held to logical 1; scanning mode responsive to alternatively pulsing said flush signal to logical 0 while holding said freeze signal to logical 0 and then pulsing said freeze signal to logical 1 while holding said flush signal to logic 1 to enable said slave latch to pass master data to said slave latch output; and flush mode by holding said flush signal to logic 0 and said freeze signal to logic 1 to simultaneously enable both said master latch and said slave latch.

15. A flip flop for performing level sensitive functional operations, comprising:

a multiplexer operable under control of a scan enable signal for generating selectively from functional data and scan data inputs to said flip flop a multiplexer output signal;

a master latch for generating a master latch output signal from said multiplexer output signal and the NAND of a flush signal with an edgeclock signal;

a slave latch for generating a flip flop output signal from said master latch output signal and the AND of a freeze signal and said edgeclock signal; and said edgeclock signal being held to logic 1 such that said freeze signal and said flush signal operate as a pair of level sensitive clocks and said master latch and said slave latch operate as a pair of level sensitive latches.

16. A method for operating a flip flop, comprising the steps of:

generating responsive to a scan enable signal from functional data and scan data inputs to said flip flop a multiplexer output signal;

generating a master latch output signal from said multiplexer output signal and the NAND of a flush signal with an edgeclock signal; and generating a slave latch output signal from said master latch output signal and the AND of a freeze signal and said edgeclock signal.

17. The method of claim 16, further for performing edge sensitive operations comprising the steps of:

generating under control of a scan enable signal selectively from functional data and scan data inputs to said flip flop a multiplexer output signal;

generating a master latch output signal from said multiplexer output signal and the NAND of a flush signal with an edgeclock signal;

generating a flip flop output signal from said master latch output signal and the AND of a freeze signal and said edgeclock signal; and clocking data responsive to said edgeclock signal from said multiplexer through said master latch and said slave latch to the output of said flip flop when said flush signal and said freeze signal are both logical 1.

18. The method of claim 17 comprising the further step of performing functional operations responsive to said scan enable signal being held to logic 0.

19. The method of claim 17 comprising the further step of performing scan operations responsive to said scan enable signal being held to logic 1.

20. The method of claim 17 comprising the further step of performing freeze operations responsive to said freeze signal being held to logic 0, whereby power is reduced by preventing switching activity in logic fed by said flip flop.

21. The method of claim 17 comprising the further step of performing flush operations responsive to said flush signal being held at logic 0 while said freeze signal and said edgeclock signals are held at logic 1, whereby responsive to said scan enable being logical 1 scan data is flushed through said flip flop and responsive to said scan enable being logical 0 functional data is flushed through said flip flop.

22. A method for operating a flip flop for performing level sensitive functional operations, comprising the steps of:

generating responsive to a scan enable signal from functional data and scan data inputs to said flip flop a multiplexer output signal;

generating a master latch output signal from said multiplexer output signal and the NAND of a flush signal with an edgeclock signal;

generating a slave latch output signal from said master latch output signal and the AND of a freeze signal and said edgeclock signal;

responsive to said edgeclock signal being held to logic 1, operating said freeze signal and said flush signal as a pair of level sensitive clocks and said master latch and said slave latch operate as a pair of level sensitive latches.

* * * * *